United States Patent [19]
Rasche et al.

[11] Patent Number: 5,938,599
[45] Date of Patent: Aug. 17, 1999

[54] MR METHOD AND ARRANGEMENT FOR CARRYING OUT THE METHOD

[75] Inventors: Volker Rasche; Peter Börnert; Kai-Michael Lüdeke; Michael Kuhn, all of Hamburg, Germany

[73] Assignee: U.S. Philips Corporation, New York, N.Y.

[21] Appl. No.: 08/754,360

[22] Filed: Nov. 22, 1996

[30] Foreign Application Priority Data

Nov. 24, 1995 [DE] Germany ............................ 195 43 785

[51] Int. Cl.⁶ .................................................. A61B 5/055
[52] U.S. Cl. ......................... 600/410; 324/307; 324/309
[58] Field of Search .................................. 600/407, 411, 600/420, 424, 431; 324/307, 309, 318

[56] References Cited

U.S. PATENT DOCUMENTS

| | | | |
|---|---|---|---|
| 4,572,198 | 2/1986 | Codrington | 600/410 |
| 5,170,789 | 12/1992 | Narayan et al. | 600/423 |
| 5,211,165 | 5/1993 | Dumoulin et al. | 600/410 |
| 5,265,610 | 11/1993 | Darrow et al. | 600/410 |
| 5,271,400 | 12/1993 | Dumoulin et al. | 600/410 |
| 5,303,707 | 4/1994 | Young | 600/410 |
| 5,307,808 | 5/1994 | Dumoulin et al. | 600/420 |
| 5,318,025 | 6/1994 | Dumoulin et al. | 600/424 |
| 5,353,795 | 10/1994 | Souza et al. | 600/424 |
| 5,377,678 | 1/1995 | Dumoulin et al. | 600/410 |
| 5,715,822 | 2/1998 | Watkins et al. | 600/423 |

FOREIGN PATENT DOCUMENTS

4310993A1  10/1994  Germany .

OTHER PUBLICATIONS

"Real-Time Position Monitoring of Invasive Devices using Magnetic Resonance", by C.L. Dumoulin et al., pp. 411–415, (1993).

"A k-Space Analysis of Small-Tip Angle Excitation", by John Pauly et al., Journal of Magnetic Resonance 81, pp. 43–56 (1989).

*Primary Examiner*—Brian L. Casler
*Attorney, Agent, or Firm*—Dwight H. Renfrew, Jr.

[57] ABSTRACT

The position of an object, for example a catheter, in a body to be examined is determined so as to enable monitoring of its movement through the body at the same time that information concerning the anatomy in the surroundings of the object is to be acquired. An as high as possible temporal and spatial resolution should be achieved for this purpose. To this end, the nuclear magnetization in the surrounding region of the object is determined by means of a micro-coil which is mounted on the inserted object, it being possible to determine the position of the object from the nuclear magnetization. Subsequently, an RF coil system is used to perform a line scan around this position in order to determine the nuclear magnetization in a line-shaped region.

22 Claims, 5 Drawing Sheets

MR METHOD AND ARRANGEMENT FOR CARRYING OUT THE METHOD

BACKGROUND OF THE INVENTION

1. Field of the Invention

The invention relates to an MR method in which the position of an object introduced into a body to be examined is determined in order to monitor the movement of the object in the body.

2. Description of the Related Art

A method of this kind is known from Magnetic Resonance in Medicine, 29, pp. 411–415 (1993). Therein, a micro-coil mounted on a surgical instrument detects MR signals from nuclear spins situated in the vicinity of the micro-coil. During the movement of the instruments MR images are generated on the basis of gradient echos, the gradient direction being switched to a different direction after each RF pulse. The frequency of the spin resonance signals received during application of the magnetic gradient fields is linearly linked to the position of the micro-coil, so that the tip of the instrument can be localized by one-dimensional Fourier transformation of these signals.

For interventional applications it is often desirable to monitor the position of a surgical instrument, for example a catheter, during the intervention and to acquire at the same time additional anatomical information concerning the surroundings of the instrument. A first problem then encountered is that the temporal resolution of the instrument position must be very high.

A second problem consists in that the spatial position of the instrument should be determined as exactly as possible. In a method which is known from DE-A 43 10 993, an MR survey image is formed first. During the intervention, only the position of the instrument, having a suitable MR contrast, is determined. The position data thus acquired is then superposed on the data set of the MR survey image acquired before the intervention, so that the surgeon is at all times informed about the position of the instrument and the anatomy in its surroundings. However, the anatomy is liable to change in the course of the intervention, for example due to movement of the body or due to the surgical intervention, so that errors could occur upon mapping of the position in the MR survey image and in the worst case the surgeon would be shown an anatomy which is not correlated to the position of the instrument.

SUMMARY OF THE INVENTION

It is an object of the present invention to enhance an MR method of the kind set forth.

This object is achieved according to the invention in that at least one coordinate of the position of the object is determined, that subsequently the nuclear magnetization is determined in a line-shaped region around this position in order to form MR images of a surrounding region of the object, and that during the movement of the object this process is continuously repeated for different positions of the object. According to the invention, the position of the object determines where the line-shaped region in which the nuclear magnetization is to be determined is situated, i.e. where a so-called line-scan is to be acquired. The continuous execution of line scans during the intervention enables formation of MR images which show the surrounding region of the path traveled by the instrument and also its instantaneous position. It is advantageous that no deviation can occur between the actual position of the object and the object position shown in the MR image, because position determination and execution of one or more line scans around this position directly succeed one another in time.

In a version of the method of the invention all three coordinates of the position of the object are determined and subsequently the nuclear magnetization is determined in one, two or three mutually orthogonal line-shaped regions around this position. The execution of mutually orthogonal line scans offers the advantage that the MR images thus formed provide very simple orientation so that the radiologist can very readily recognize where the object is situated at any instant. Moreover, the position of the object is exactly determined, because all three position coordinates are determined.

In an alternative version of the invention, the three coordinates of the position of the object as well as the nuclear magnetization in three mutually orthogonally arranged line-shaped regions around this position are successively determined in three process steps, in one process step there being determined exactly one coordinate of the position of the object and the nuclear magnetization in a line-shaped region around this position. This means that during a first step only one coordinate is determined and one line scan is performed, and in a second and a third step a respective further coordinate and a further line scan, being situated each time orthogonally to the first line scan. The inaccuracy introduced because of the distance traveled by the object during these three process steps is negligibly small, because the three process steps together can be performed within approximately 0.1 second and the distance traveled by the object during this time will generally be very small. Alternatively, the execution of a line scan during the second and the third process step can be dispensed with. Moreover, in order to form an isotropic representation the method can be extended in such a manner that after the execution of a line scan in a given direction the object must have traveled a given distance before the next line scan is performed in the same direction.

It is particularly attractive that according to the invention the determination of at least one coordinate of the position of the object and the determination of the nuclear magnetization in a line-shaped region are performed by means of a single MR sequence. Such an MR sequence includes, for example an RF excitation pulse and an RF refocusing pulse as well as three temporally successively applied magnetic field gradients in different directions. This combination of position determination and line scan in an MR sequence is particularly fast. In order to obtain further coordinates of the position and further line scans around the same position, the MR sequence is repeated once or twice with other magnetic field gradients.

In one version of the invention at least one MR survey image is formed and the position of the object and/or the line-shaped region around this position is superposed on the MR survey image. The line-shaped region can be used on the one hand to superpose the position of the object on the MR survey image in the correct position. On the other hand, the MR image formed by the line scans during the intervention can also be superposed on the MR survey image, because, for example due to surgical interventions the anatomy could have changed in comparison with the anatomy shown in the MR survey image. Ultimately a more accurate and more up-to-date image is thus obtained, without the overall view being lost.

In a further version of the invention the instantaneous position of the object or the trajectory traveled by the object is used to select the slice to be excited for the next position determination. It is thus ensured that the object is indeed present in the excited slice during the position determination and the execution of the line scan. If the speed of the object is so high that it moves out of the excited slice between two position determination operations, additional position determination operations can also be performed to determine the speed and the direction of movement of the catheter so that the correct slice can be excited for the next position determination and/or the next line scan. The path traveled by the object can also be determined approximately from the object positions determined thus far and on the basis thereof the location whereto the object will move can be estimated. This estimate can also be used for determining the slices to be excited.

An arrangement for carrying out the method according to the invention includes a gradient coil system for generating magnetic gradient fields in an examination zone exposed to a steady, uniform magnetic field, an RF coil system for generating an RF magnetic field or for receiving MR signals from the examination zone, an object which is to be introduced into the body to be examined and includes means for receiving MR signals from the surrounding region, means for controlling the temporal variation of the currents in the gradient coil system and/or the RF coil system and/or the micro coil, control being performed in such a manner that at least one coordinate of the position of the object is determined, that subsequently the nuclear magnetization is determined in a line-shaped region around the relevant position in order to form MR images of a surrounding region of the object, and that this process is continuously repeated for different positions of the object during the movement of the object, and also includes means for displaying the MR images formed from the measured values.

In a further embodiment of the arrangement according to the invention the means for receiving MR signals from the surrounding region include a micro-coil or a permanent magnet or an electromagnet. Other means suitable for receiving MR signals are also feasible, said means utilizing special properties of given metals or given liquids.

The method according to the invention enables anatomical information to be acquired from up to three orthogonal surfaces along the trajectory of a surgical instrument during an intervention. Because of the high spatial and temporal resolution, this information can serve as a direct orientation tool for the radiologist. Alternatively, the data thus acquired may also be used to improve the correlation between the position of the instrument and data acquired prior to the intervention, for example an MR survey image.

BRIEF DESCRIPTION OF THE DRAWINGS

The invention will be described in detail hereinafter with reference to the drawings. Therein.

DETAILED DESCRIPTION OF THE PREFERRED EMBODIMENTS

Figure 1:
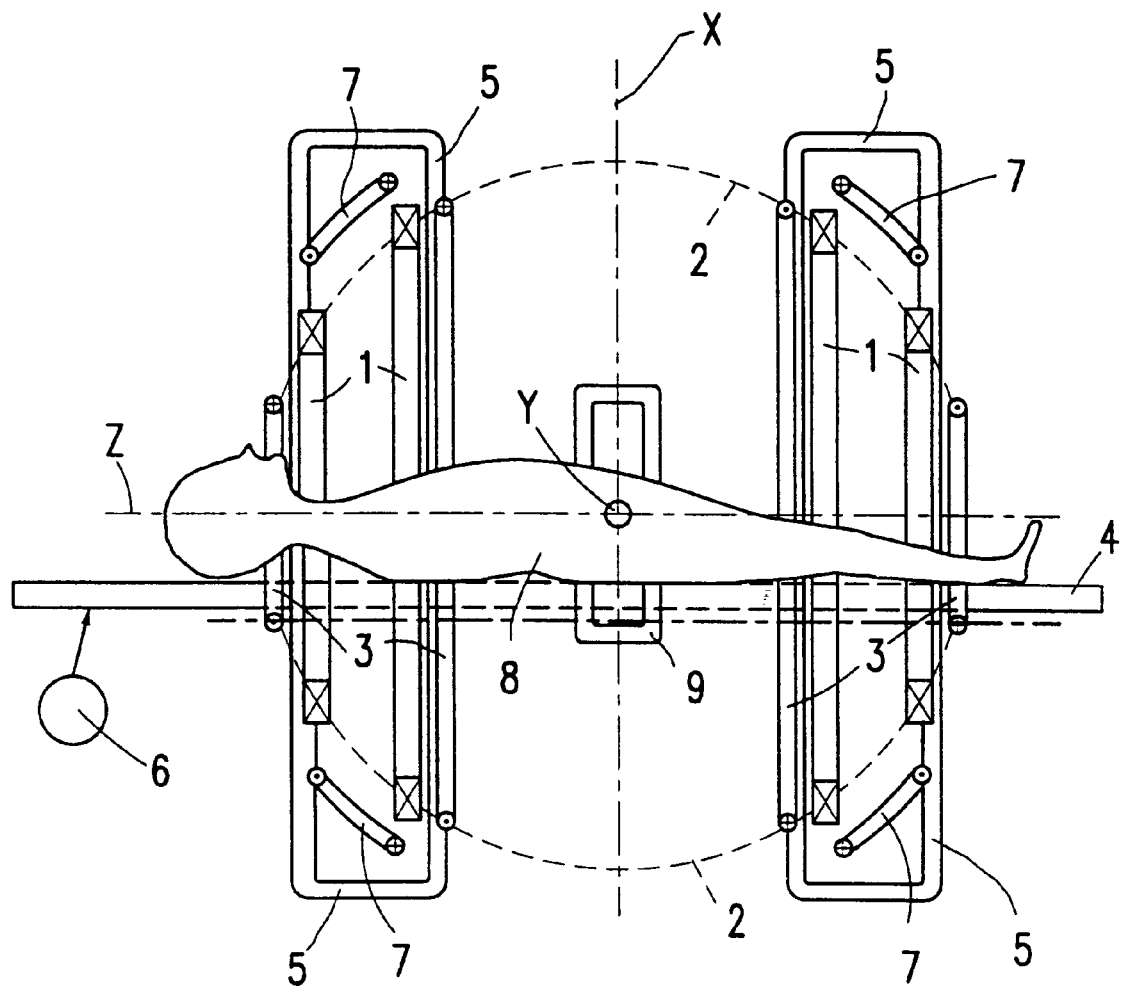
FIG. 1 shows a magnetic resonance examination apparatus for carrying out the method of the invention.

The magnetic resonance examination apparatus which is diagrammatically shown in FIG. 1 comprises an arrangement of four coils 1 for generating a uniform, steady magnetic field. The coils 1 are concentrically situated with respect to the z-axis and may be arranged on a spherical surface 2. The patient 8 to be examined is positioned within the coils 1 and is accommodated on a table top 4 which is displaceable in the longitudinal direction of the patient 8 by means of a motor drive 6, i.e. in the z-direction.

A set of four coils 3 are arranged on the spherical surface 2, or on a cylindrical surface, in order to generate a magnetic field which extends in the z-direction and varies linearly in this direction. Also provided is a set of four coils 7 which generate a magnetic gradient field which also extends in the z-direction but whose gradient extends in the x-direction (vertically). A magnetic gradient field which extends in the z-direction and has a gradient in the y-direction (perpendicularly to the plane of drawing of FIG. 1) is generated by a set of four coils 5 which may be identical to the coils 7 but have been rotated through 90° in space with respect thereto. Only two of the set of four coils 5 are shown in FIG. 1. The coil sets 3, 4 and 5 together comprise a gradient coil system.

There is also provided an RF coil 9 which generates an essentially uniform RF magnetic field which extends perpendicularly to the direction of the steady, uniform magnetic field (i.e. perpendicularly to the z-direction). The RF coil 9 receives an RF modulated current from an RF generator during each RF pulse. The RF coil 9 could also serve to receive the spin resonance signals generated in the examination zone. Preferably, however, a separate RF receiving coil 11 (not shown in FIG. 1) is used for this purpose, the RF coil 9 and any such separate RF receiving coil 11 together comprising an RF coil system.

Figure 2:
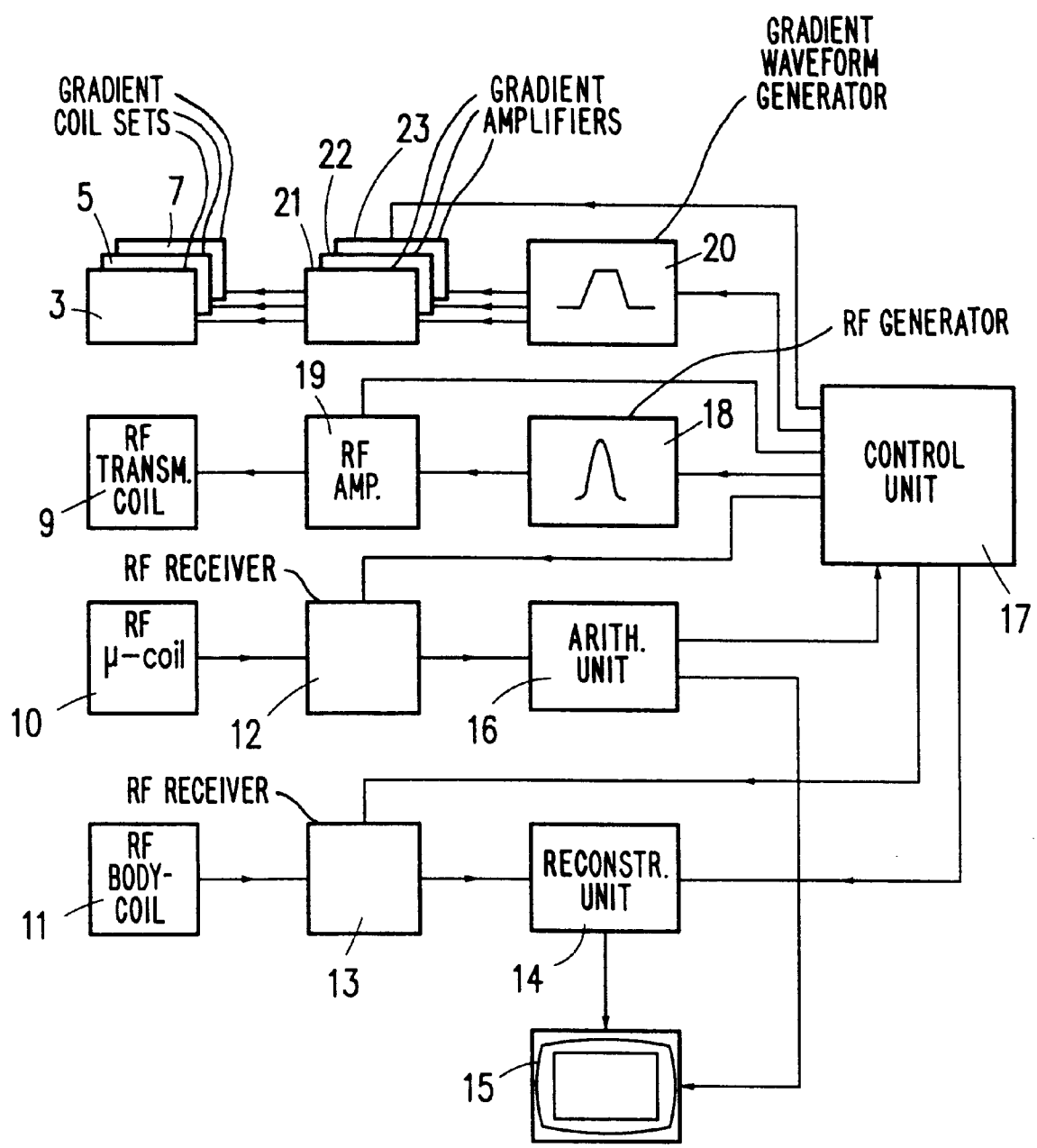
FIG. 2 shows a block diagram of such an apparatus.

FIG. 2 shows a block diagram of a magnetic resonance examination apparatus for carrying out the method of the invention. The current for the gradient coils 3, 5 and 7 is supplied by gradient amplifiers 21, 22, 23 which are controlled by a control unit 17. The variation in time of the magnetic gradient fields is governed by a gradient waveform generator 20 which is also controlled by the control unit 17. The control unit 17 also controls the gain of an RF amplifier 19 as well as a RF pulse generator 18 for the RF coil 9.

A catheter which is to be introduced into the body of the patient and whose trajectory through the body is to be monitored is provided with a small micro-coil 10 ($\mu$-coil) which can receive MR signals only from a small region around the micro-coil 10. The signals received are amplified in a receiver 12, mixed with a signal of constant frequency and digitized. The output signal is applied to an arithmetic unit 16 which determines the position of the micro-coil 10 and hence that of the catheter therefrom.

Furthermore, said RF receiving coil 11 (body coil) is shown as one block, it is usually constructed as a whole-body coil, but may also consist of a plurality of so-called synergy coils. The MR signals measured thereby are also amplified by a receiver 13, mixed and digitized. Subsequently, the digitized signal is applied to an image reconstruction unit 14 in which an MR image is reconstructed for display on a monitor 15. The position of the catheter can also be superposed on the MR image.

The instant at which and the period of time during which the receiving coils 10 and 11 should receive MR signals are controlled by the control unit 17, via the receivers 12 and 13. The type of excitation by RF pulses as well as the type and succession in time of the gradient fields is dependent on the position of the catheter, which is why the information concerning the position is supplied via a connection from the arithmetic unit 16 to the control unit 17.

Figure 3:
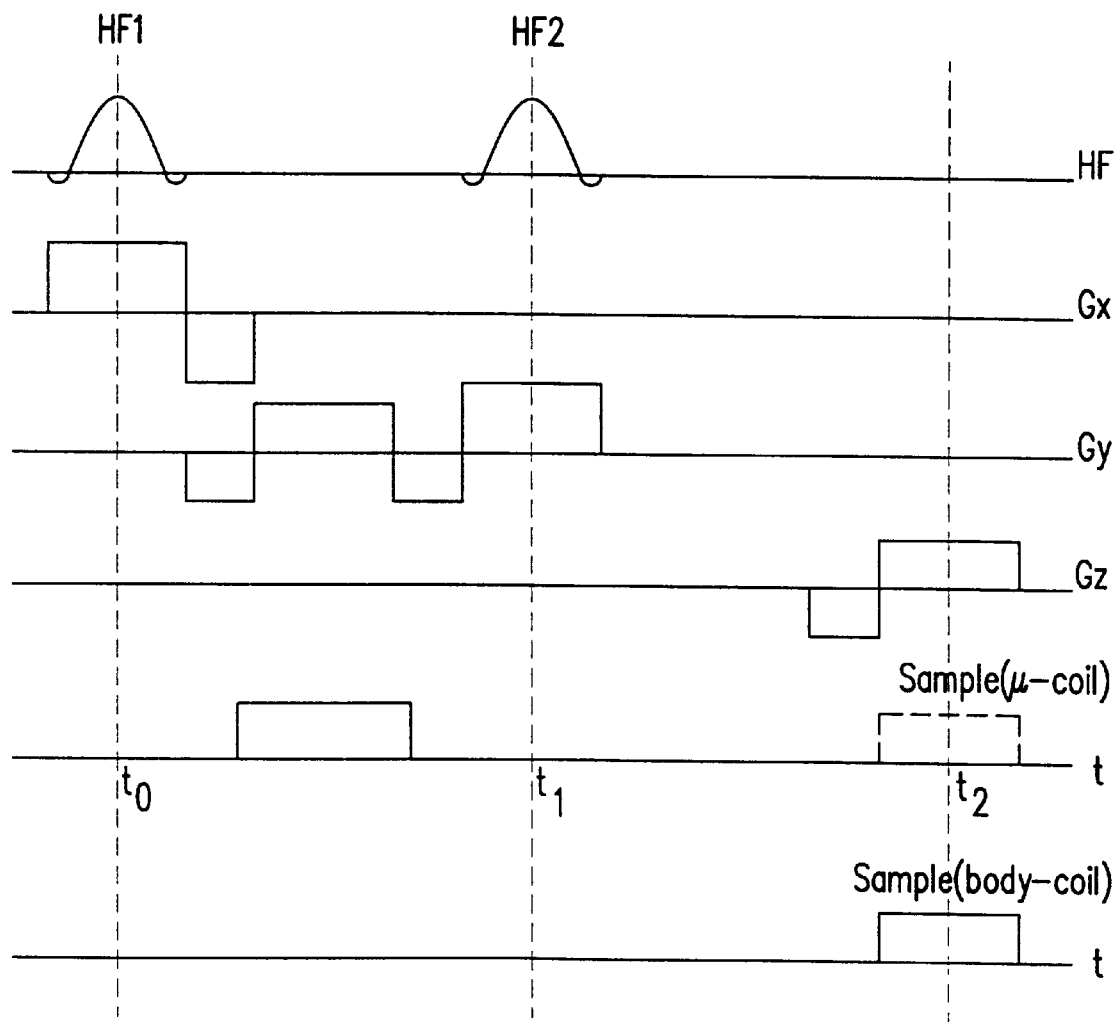
FIG. 3 shows the variation in time of various signals in a sequence for executing the method of the invention.

FIG. 3 shows a sequence for the method of the invention whereby two coordinates of the position of the catheter can be determined and at the same time also the nuclear magnetization in a line-shaped region (referred hereinafter as a line scan for the sake of brevity) around this position. The first line of FIG. 3 shows the position in time of the RF pulses; the second to fourth lines show the magnetic gradient fields $G_x$, $G_y$, $G_z$ which are active during or after the RF pulses and whose gradients extend in the x- direction, the y-direction and the z-direction, respectively. The fifth line shows the position in time of the interval in which the signals received by the micro coil 10 are processed by the receiver 12. The sixth line shows the position in time of the interval in which the signals received by the RF receiving coil 11 are processed by the receiver 13.

The sequence commences with a 90° RF pulse HF1 at the instant $t_0$; this pulse is accompanied by a magnetic gradient field $G_x$ whose gradient extends in the x-direction. The center frequency of the RF pulse HF1, the magnitude of the so-called selection gradient of the magnetic gradient field $G_x$ and its variation in time are chosen so that excitation and subsequent rephasing of the nuclear magnetization take place in a slice extending perpendicularly to the x-direction. At the instant at which the direction of the gradient field $G_x$ changes, a second gradient field $G_y$ is applied with a gradient in the y-direction. The gradient field $G_y$ initially has a negative polarity until the gradient field $G_x$ is switched off. At that instant the polarity of the gradient field $G_x$ is reversed. During the period of time in which the magnetic gradient field $G_y$ is constant, the MR signals generated in the examination zone are picked-up by the micro-coil as shown in the fifth line. Because the micro-coil can receive MR signals from a very small region only, Fourier transformation of the signal measured reveals the position of the micro-coil and hence of the catheter along the y-axis, because the signal exhibits a peak in one position only. After the period of positive polarity of the gradient field $G_y$ and after termination of the acquisition of the measuring values by the micro coil, the polarity of the gradient field $G_y$ becomes negative again. The gradient field $G_y$ remains switched on with negative polarity until the time integral over the gradient $G_y$, from activation until the end of the second period of time with negative polarity, equals zero so that at that instant all nuclear spins are in phase again.

Subsequently, polarity reversal of the gradient field $G_y$ in the positive direction takes place, again, i.e. a so-called selection gradient in the y-direction, a 180° RF pulse HF2 with a maximum at the instant $t_1$ being generated at the same time. A slice oriented perpendicularly to the y-direction is thus refocused. After deactivation of the gradient $G_y$ and the RF pulse HF2, a gradient field $G_z$ acts on the examination zone. The direction of this gradient is reversed after a given instant, the variation in time being chosen so that the time integral over the gradient until the polarity reversal amounts to half the time integral from the polarity reversal until the deactivation of the gradient field $G_z$.

During the period in which the gradient field $G_z$ is constant after the polarity reversal, the MR signals generated in the examination zone are detected by the RF receiving coil, i.e. the associated receiver 13 (in FIG. 2) is switched to the receiving mode as indicated in the sixth line. Thus, the nuclear magnetization (a so-called spin echo) is detected in a line-shaped region extending in the z-direction around the position of the catheter.

At the same time the position of the catheter in the z direction can also be determined when the receiver of the micro coil is also switched to the receiving mode. This is denoted by a dashed line in the fifth line in FIG. 3.

Moreover, the variation in time of the gradient field $G_z$ is determined by the position in time of the two RF pulses: the period of time elapsing between the maximum of the second RF pulse HF2 and half the receiving time of the RF receiving coil ($t_2-t_1$) should correspond, for the gradient variations shown, to the time difference between the two RF pulses ($t_1-t_0$) so as to enable reception of the largest possible spin echo signal.

In order to obtain also the third coordinate of the position of the catheter and/or further line scans in directions orthogonal to the first line scan, the sequence shown is repeated once or twice, the directions of the gradient fields being cyclically interchanged in a suitable manner. This process is continuously repeated during the movement of the catheter in the body so that this movement can be monitored and MR images can be formed of the surroundings of the catheter.

For the execution of the described method it is important that the speed of measurement of the catheter is not too high, so that the catheter is not moved out of the excited slice during the position determination and the execution of one or more line scans. Moreover, the first RF pulse HF1 should excite a slice in which the micro coil is situated. To this end, the position of the catheter should be determined by means of a known method, for example prior to the execution of the method according to the invention. During the execution of the method the position of the catheter just determined can be used to select the frequency for the first RF pulse HF1 whereby the position of the excited slice can be determined. Similarly, the position can also be used to select the frequency of the second RF pulse HF2 which determines the position of the slice in which the nuclear spins are refocused.

It is also possible to determine first a few catheter positions in order to determine the speed and the direction in which the catheter is moved therefrom. Moreover, the direction in which the catheter will move can be estimated from positions determined thus far.

For the execution of the method according to the invention it is not necessary that the RF pulses HF1 and HF2 have the described angle of 90° or 180°. The RF pulses may also have other angles, depending on the necessary repetition time of the MR sequence.

Figure 4:
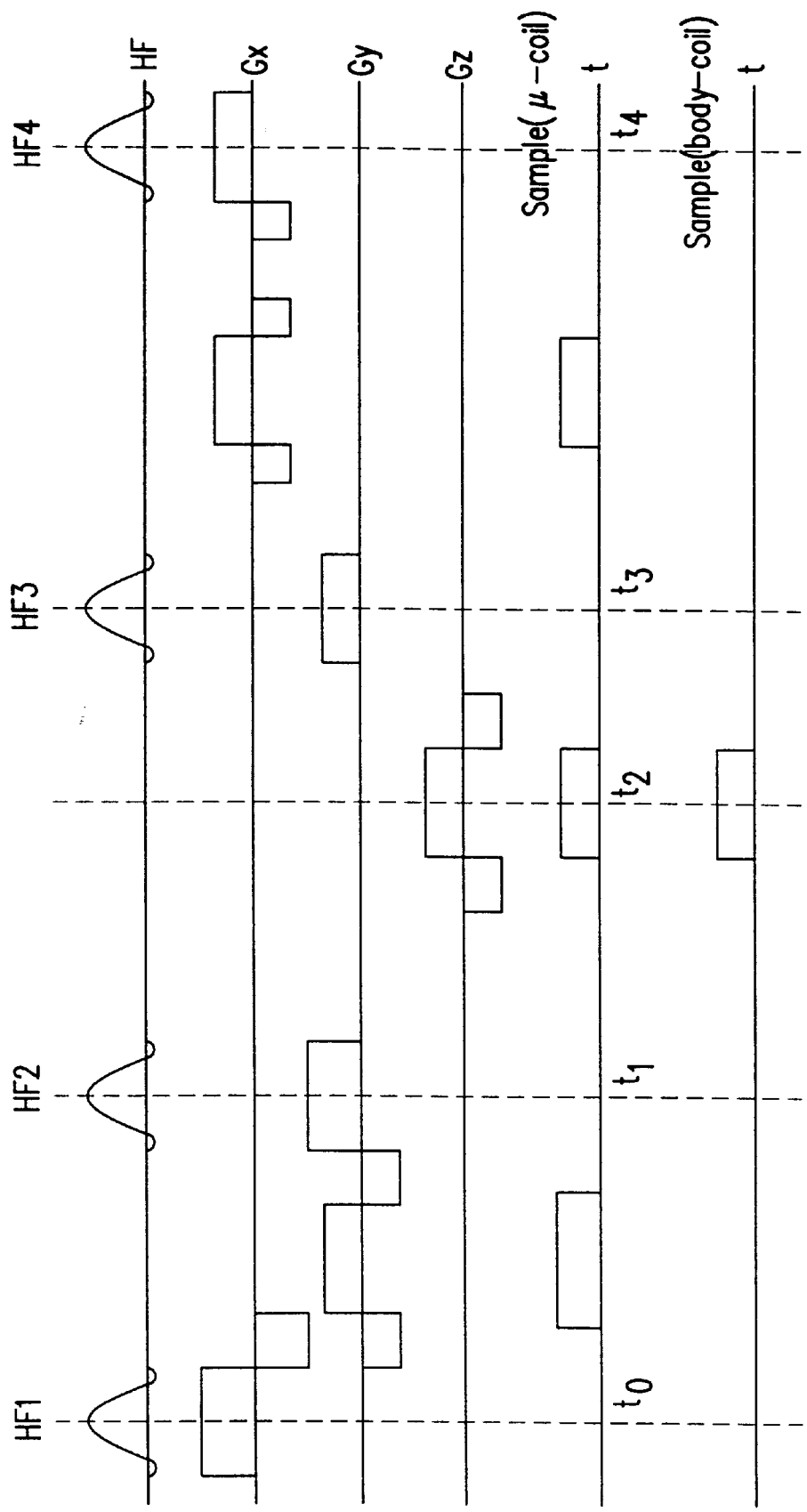
FIG. 4 shows a further sequence for determining three position coordinates.

FIG. 4 shows a further sequence for executing the method of the invention. Until the instant $t_2$ this sequence corresponds exactly to the sequence described with reference to FIG. 3. In order to enable determination of the third coordinate also of the catheter position by means of this sequence, first the polarity of the gradient field $G_z$ is reversed in the negative direction again, i.e. until ultimately all nuclear spins are in phase again. After deactivation of the gradient field $G_z$, a further 180° RF pulse HF3 is generated with a maximum at the instant $t_3$, a gradient field $G_y$ of positive polarity being applied at the same time. This yields slice selection in the y-direction. After deactivation of the gradient $G_y$ and the RF pulse HF3, the examination zone is exposed to a gradient field $G_x$ with the same variation in time as the previously applied gradient $G_z$ (at the instant $t_2$).

During the period in which this gradient field $G_x$ is constant with a positive polarity, the third coordinate (in the x-direction) of the catheter position can be determined as appears from the fifth line.

In order to reduce saturation effects and also the time elapsing before the next position or the next line scan can be determined by means of a further sequence, at the instant $t_4$ there is applied a further 90° RF pulse which returns the magnetization direction of the nuclear spins to the original position (in the z-direction) prior to the start of the complete sequence. At the same time a selection gradient $G_x$ of positive polarity is applied. Before that, and before application of the RF pulse HF4, a gradient field $G_x$ of negative polarity is applied, causing rephasing of the nuclear spins.

Figure 5:
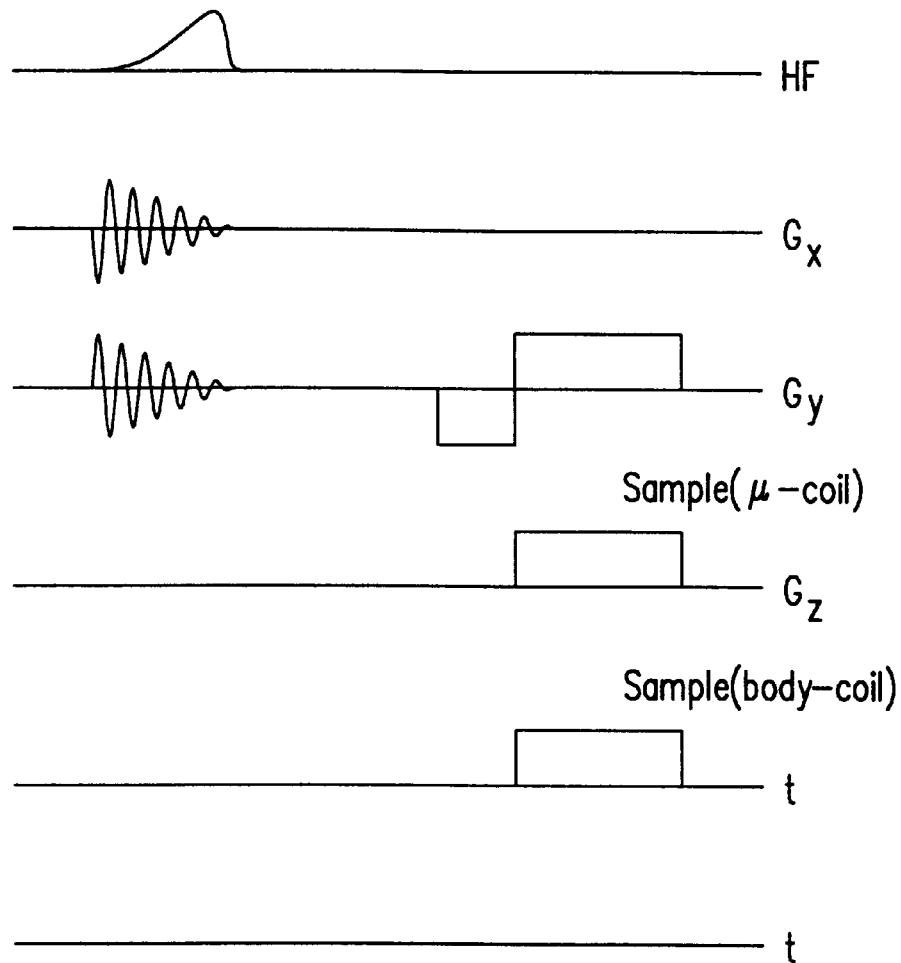
FIG. 5 shows an alternative sequence.

FIG. 5 shows an alternative sequence for the method of the invention. The magnetization is then excited in a line-shaped region in the z-direction by a non-symmetrical RF pulse and oscillating gradient fields $G_x$ and $G_y$ which are applied temporally in parallel therewith. This type of excitation of a line-shaped cylindrical region is known from Journal of Magnetic Resonance 81, pp. 43–56 (1989) and, therefore, will not be elaborated herein. Subsequently, the read gradient $G_z$ already described with reference to FIG. 3 is applied; after its polarity reversal, MR signals are received simultaneously by the micro-coil and the RF receiving coil. This sequence enables determination of a coordinate of the position of the micro-coil as well as execution of a line scan (in this case in the z-direction) around this position. All three components of the position as well as three mutually orthogonal line scans will have been obtained after two further repeats of this sequence, involving cyclical interchanging of the gradients.

Figure 6:
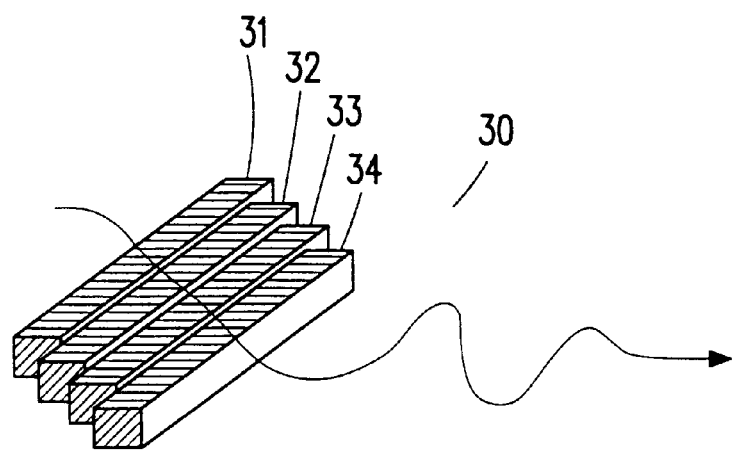
FIG. 6 shows the trajectory of a catheter and line-shaped regions reproduced during its movement.

The reference 30 in FIG. 6 denotes the trajectory of a catheter, for example in a blood vessel. The references 31 to 34 denote four line scans, determined by means of the method according to the invention during the movement of the catheter through the body along the curve 30.

The cycle involving the position determination of the catheter and the measurement of one or more line scans around each catheter position measured is repeated during the intervention so that an MR image can be formed of the trajectory already traveled by the catheter. Generally speaking, however, the surface area thus covered by the line scans will not constitute a flat surface, because the catheter, generally speaking, is not moved along a curve situated in one plane and the position of the line scans is dependent on the position of the catheter.

The MR method can be executed in such a manner that for each measured position of the catheter exactly three mutually orthogonal line scans are performed. This is particularly advantageous because the radiologist can orientate himself very easily on the basis of orthogonal slice images. However, it is alternatively possible to perform line scans which are not mutually orthogonal. Moreover, it is not necessary either for the line scans to be situated along the main axes along which the gradient fields are also directed.

The method can also be extended in such a manner that line scans are not performed after every position determination of the catheter, but only when the catheter has traveled a given distance. This ensures that the display is as isotropic as possible when the line scans are concatenated in one direction.

We claim:

1. An MR method of determining positions of and images of a region surrounding an object introduced into a body to be examined in order to monitor a movement of the object in the body, comprising the steps of:

determining at least one coordinate of an instantaneous position of the object, subsequently determining nuclear magnetization in a line-shaped region through the instantaneous position, said determining comprising using said at least one coordinate to select a slice to be excited or refocused, continuously repeating this process during the movement of the object for different instantaneous positions of the object, and determining positions of the object and forming MR images of a region surrounding the object are formed.

2. An MR method as claimed in claim 1, comprising the steps of determining three coordinates of an instantaneous position of the object and subsequently determining the nuclear magnetization in one or more mutually orthogonal line-shaped regions through the instantaneous position, said determining comprising using at least one of said three determined coordinates to select slices to be excited or refocused.

3. An MR method as claimed in claim 2, wherein said step of determining at least one coordinate of the position of the object and the step of determining the nuclear magnetization in a line-shaped region are performed by a single MR sequence.

4. An MR method as claimed in claim 3, further comprising the steps of forming at least one MR survey image and superposing the instantaneous position of the object and/or the line-shaped region through the instantaneous position on the MR survey image.

5. An MR method as claimed in claim 2, further comprising the steps of forming at least one MR survey image and superposing the instantaneous position of the object and/or the line-shaped region through the instantaneous position on the MR survey image.

6. An MR method as claimed in claim 5, further comprising a step of using the trajectory traveled by the object to select a slice to be excited for a next position determination and for a determination of the nuclear magnetization in a line-shaped region through said next position.

7. An MR method as claimed in claim 2, further comprising a step of using the trajectory traveled by the object to select a slice to be excited for a next position determination and for a determination of the nuclear magnetization in a line-shaped region through said next position.

8. An MR method as claimed in claim 1, comprising the steps of successively determining three coordinates of an instantaneous position of the object as well as the nuclear magnetization in three mutually orthogonal line-shaped regions through the instantaneous position in three process steps, wherein exactly one coordinate of the instantaneous position of the object and the nuclear magnetization in a line-shaped region through the instantaneous position are determined in one of said process steps.

9. An MR method as claimed in claim 8, wherein said step of determining at least one coordinate of the position of the object and the step of determining the nuclear magnetization in a line-shaped region are performed by a single MR sequence.

10. An MR method as claimed in claim 9, further comprising the steps of forming at least one MR survey image and superposing the instantaneous position of the object and/or the line-shaped region through the instantaneous position on the MR survey image.

11. An MR method as claimed in claim 8, further comprising the steps of forming at least one MR survey image and superposing the instantaneous position of the object and/or the line-shaped region through the instantaneous position on the MR survey image.

12. An MR method as claimed in claim 8, further comprising a step of using the trajectory traveled by the object to select a slice to be excited for a next position determination and for a determination of the nuclear magnetization in a line-shaped region through said next position.

13. An MR method as claimed in claim 1, wherein said step of determining at least one coordinate of the instantaneous position of the object and the step of determining the nuclear magnetization in a line-shaped region are performed by a single MR sequence.

14. An MR method as claimed in claim 13, further comprising the steps of forming at least one MR survey image and superposing the instantaneous position of the object and/or the line-shaped region through the instantaneous position on the MR survey image.

15. An MR method as claimed in claim 13, further comprising a step of using the trajectory traveled by the object to select a slice to be excited for a next position determination and for a determination of the nuclear magnetization in a line-shaped region through said next position.

16. The MR method of claim 13 wherein the step of determining nuclear magnetization in a line-shaped region further comprises determining at least two coordinates of the instantaneous position of the object along the line-shaped region.

17. An MR method as claimed in claim 1, further comprising the steps of forming at least one MR survey image and superposing the instantaneous position of the object and/or the line-shaped region through this instantaneous position on the MR survey image.

18. An MR method as claimed in claim 17, further comprising a step of using the trajectory traveled by the object to select a slice to be excited for a next position determination and for a determination of the nuclear magnetization in a line-shaped region through said next position.

19. An MR method as claimed in claim 1, further comprising a step of using an instantaneous position of the object to select a slice to be excited for a next position determination and for a determination of the nuclear magnetization in a line-shaped region through said next position.

20. An MR method as claimed in claim 1, further comprising a step of using the trajectory traveled by the object to select a slice to be excited for a next position determination and for a determination of the nuclear magnetization in a line-shaped region through said next position.

21. An MR system comprising:

a gradient coil system for generating magnetic gradient fields in an examination zone exposed to a steady, uniform magnetic field, an RF coil system, an object which is adapted to be introduced into a body to be examined and includes means for receiving MR signals from a surrounding region, means controlling temporal variation of the currents in the gradient coil system and the RF coil system, said means controlling the temporal variations of the currents for determining at least one coordinate of an instantaneous position of the object, for subsequently determining nuclear magnetization in a line-shaped region through the instantaneous position, said determining comprising using said at least one coordinate to select a slice to be excited or refocused, and for continuously repeating this controlling and determining for different instantaneous positions of the object during movement of the object, wherein positions of the object are determined and MR images of a region surrounding the object are formed, and means for displaying the MR images formed.

22. An object as claimed in claim 21, wherein the means for receiving MR signals from the surrounding region is micro-coil.

* * * * *